(12) United States Patent
Avital et al.

(10) Patent No.: US 8,330,606 B2
(45) Date of Patent: Dec. 11, 2012

(54) SECURE DATA ENTRY DEVICE

(75) Inventors: Amihay Avital, Bat Hefer (IL); Shih-An Steve Hsu, Taoyuan (TW); Chi-Jung Bruno Luo, Taipei (TW); Yung-Tai James Jiang, Luzhou (TW); Richard Neo, Singapore (SG)

(73) Assignee: Verifone, Inc., San Jose, CA (US)

( * ) Notice: Subject to any disclaimer, the term of this patent is extended or adjusted under 35 U.S.C. 154(b) by 259 days.

(21) Appl. No.: 12/758,150

(22) Filed: Apr. 12, 2010

(65) Prior Publication Data

US 2011/0248860 A1 Oct. 13, 2011

(51) Int. Cl.
*G08B 21/00* (2006.01)
(52) U.S. Cl. ......... 340/635; 340/652; 235/492; 235/135
(58) Field of Classification Search .................. 340/352, 340/652, 635; 345/168–172; 235/492
See application file for complete search history.

(56) References Cited

U.S. PATENT DOCUMENTS

| | | | |
|---|---|---|---|
| 3,466,643 A | 9/1969 | Moorefield | |
| 3,735,353 A | 5/1973 | Donovan et al. | |
| 3,818,330 A | 6/1974 | Hiroshima et al. | |
| 4,486,637 A | 12/1984 | Chu | |
| 4,527,030 A * | 7/1985 | Oelsch | 200/515 |
| 4,593,384 A | 6/1986 | Kleijne | |
| 4,749,368 A * | 6/1988 | Mouissie | 439/421 |
| 4,807,284 A | 2/1989 | Kleijne | |
| 4,847,595 A | 7/1989 | Okamoto | |
| 5,086,292 A | 2/1992 | Johnson et al. | |
| 5,237,307 A | 8/1993 | Gritton | |
| 5,239,664 A | 8/1993 | Verrier et al. | |
| 5,353,350 A | 10/1994 | Unsworth et al. | |
| 5,506,566 A | 4/1996 | Oldfield et al. | |
| 5,559,311 A | 9/1996 | Gorbatoff | |
| 5,586,042 A | 12/1996 | Pisau et al. | |
| 5,627,520 A | 5/1997 | Grubbs et al. | |
| 5,675,319 A | 10/1997 | Rivenberg et al. | |
| 5,861,662 A | 1/1999 | Candelore | |
| 5,877,547 A * | 3/1999 | Rhelimi | 257/679 |

(Continued)

FOREIGN PATENT DOCUMENTS

DE  2 241 738 A1  3/1973

(Continued)

OTHER PUBLICATIONS

An International Preliminary Report on Patentability dated Jul. 19, 2011 which issued during the prosecution of Applicant's PCT/IL2009/000724.

(Continued)

*Primary Examiner* — Daniel Wu
*Assistant Examiner* — Vishak Ganesh
(74) *Attorney, Agent, or Firm* — Ladas & Parry LLP (57) ABSTRACT

A secure data entry device including a housing, a keypad mounted in the housing and including a plurality of selectably depressible keys, tampering alarm indication circuitry and at least one electrical conductor located in the housing in operative association with the keypad, the at least one electrical conductor being coupled to the tampering alarm indication circuitry and being arranged such that extraction of at least one of the plurality of selectably depressible keys results in at least one break in the at least one electrical conductor, which causes the tampering alarm indication circuitry to provide a tampering alarm indication.

13 Claims, 14 Drawing Sheets

U.S. PATENT DOCUMENTS

| | | | |
|---|---|---|---|
| 5,998,858 A | 12/1999 | Little et al. |
| 6,288,640 B1 | 9/2001 | Gagnon |
| 6,359,338 B1 | 3/2002 | Takabayashi |
| 6,396,400 B1 | 5/2002 | Epstein, III et al. |
| 6,414,884 B1 | 7/2002 | DeFelice et al. |
| 6,438,825 B1 | 8/2002 | Kuhn |
| 6,463,263 B1 * | 10/2002 | Feilner et al. | 455/90.1 |
| 6,466,118 B1 | 10/2002 | Van Zeeland et al. |
| 6,563,488 B1 | 5/2003 | Rogers et al. |
| 6,646,565 B1 | 11/2003 | Fu et al. |
| 6,669,100 B1 | 12/2003 | Rogers et al. |
| 6,830,182 B2 | 12/2004 | Izuyama |
| 6,853,093 B2 | 2/2005 | Cohen et al. |
| 6,874,092 B1 | 3/2005 | Motoyama et al. |
| 6,912,280 B2 | 6/2005 | Henry |
| 6,917,299 B2 | 7/2005 | Fu et al. |
| 6,921,988 B2 | 7/2005 | Moree |
| 6,936,777 B1 * | 8/2005 | Kawakubo | 200/1 B |
| 7,170,409 B2 | 1/2007 | Ehrensvard et al. |
| 7,270,275 B1 | 9/2007 | Moreland et al. |
| 7,283,066 B2 * | 10/2007 | Shipman | 341/22 |
| 7,497,378 B2 | 3/2009 | Aviv |
| 7,784,691 B2 | 8/2010 | Mirkazemi-Moud et al. |
| 7,843,339 B2 | 11/2010 | Kirmayer |
| 7,898,413 B2 | 3/2011 | Hsu et al. |
| 2004/0031673 A1 | 2/2004 | Levy |
| 2004/0118670 A1 * | 6/2004 | Park et al. | 200/344 |
| 2004/0120101 A1 | 6/2004 | Cohen et al. |
| 2005/0081049 A1 | 4/2005 | Nakayama et al. |
| 2005/0184870 A1 | 8/2005 | Galperin et al. |
| 2006/0049255 A1 | 3/2006 | Von Mueller et al. |
| 2006/0049256 A1 | 3/2006 | Von Mueller et al. |
| 2006/0192653 A1 | 8/2006 | Atkinson et al. |
| 2007/0040674 A1 * | 2/2007 | Hsu | 340/539.31 |
| 2007/0102272 A1 | 5/2007 | Sano et al. |
| 2007/0152042 A1 * | 7/2007 | Mittler | 235/383 |
| 2007/0204173 A1 | 8/2007 | Kuhn |
| 2008/0135617 A1 | 6/2008 | Aviv |
| 2008/0180245 A1 * | 7/2008 | Hsu et al. | 340/571 |
| 2008/0278353 A1 | 11/2008 | Smith et al. |
| 2009/0058628 A1 | 3/2009 | Kirmayer |
| 2009/0184850 A1 | 7/2009 | Schulz et al. |
| 2011/0063109 A1 | 3/2011 | Ostermoller |
| 2011/0248860 A1 | 10/2011 | Avital et al. |
| 2012/0025983 A1 | 2/2012 | Ben-Zion et al. |
| 2012/0106113 A1 | 5/2012 | Kirmayer |
| 2012/0180140 A1 | 7/2012 | Barrowman et al. |

FOREIGN PATENT DOCUMENTS

| | | |
|---|---|---|
| DE | 601 01 096 T2 | 7/2004 |
| EP | 0 375 545 A1 | 6/1990 |
| EP | 0 375 545 B1 | 2/1995 |
| EP | 1 421 549 A1 | 5/2004 |
| EP | 1 432 031 A1 | 6/2004 |
| EP | 1 676 182 A1 | 7/2006 |
| EP | 1 421 549 B1 | 8/2007 |
| EP | 1 432 031 B1 | 3/2008 |
| EP | 1 676 182 B1 | 4/2008 |
| FR | 2 911 000 A1 | 7/2008 |
| FR | 2911000 A1 | 7/2008 |
| GB | 892 198 A | 3/1962 |
| GB | 1 369 739 A | 10/1974 |
| GB | 2 178 235 A | 2/1987 |
| GB | 2 372 363 A | 8/2002 |
| GB | 2 411 756 A | 9/2005 |
| JP | 2002108711 A | 4/2002 |
| JP | 2003-100169 A | 4/2003 |
| JP | 2003100169 A | 4/2003 |
| WO | 01/63994 A2 | 8/2001 |
| WO | 03/019467 A1 | 3/2003 |
| WO | 2005/041002 A1 | 5/2005 |
| WO | 2005/086546 A2 | 9/2005 |
| WO | 2009/091394 A1 | 7/2009 |
| WO | 2010/082190 A1 | 7/2010 |

OTHER PUBLICATIONS

Victor Kremin, et al; "Capacitance Sensing—Waterproof Capacitance Sensing", Cypress Perform, Dec. 2006; 11 pages.

Dave Van Ess; "Capacitive Touch Switches for Automotive Applications", http://www.automotivedesignline.com/, Feb. 2006; 7 pages.

International Search Report and Written Opinion both dated Apr. 30, 2012, issued during the prosecution of PCT/US2012/020142.

USPTO NFOA mailed May 28, 2004 in connection with U.S. Appl. No. 10/326,726.

USPTO Notice of Allowability mailed Oct. 26, 2004 in connection with U.S. Appl. No. 10/326,726.

USPTO NFOA mailed May 13, 2010 in connection with U.S. Appl. No. 11/845,435.

USPTO NOA mailed Sep. 10, 2010 in connection with U.S. Appl. No. 11/845,435.

* cited by examiner

SECURE DATA ENTRY DEVICE

REFERENCE TO RELATED APPLICATIONS

Reference is made to the following patent and patent application, owned by assignee, the disclosures of which are hereby incorporated by reference, which are believed to relate to subject matter similar to the subject matter of the present application:

U.S. Pat. No. 6,853,093;
U.S. Published Patent Application Nos. 2009/0184850 and 2007/0152042; and
U.S. patent application Ser. No. 12/715,794.

FIELD OF THE INVENTION

The present invention relates generally to secure keypad devices and more particularly to data entry devices having anti-tamper functionality.

BACKGROUND OF THE INVENTION

The following patent publications are believed to represent the current state of the art:

U.S. Published Patent Application No. 2008/0278353;
U.S. Pat. Nos. 7,270,275; 6,646,565; 6,917,299 and 4,486,637;
European Patent Nos.: 1421549 and 1676182; and
Great Britain Patent Application No. GB8608277.

SUMMARY OF THE INVENTION

The present invention seeks to provide improved secure keypad devices.

There is thus provided in accordance with a preferred embodiment of the present invention a secure data entry device including a housing, a keypad mounted in the housing and including a plurality of selectably depressible keys, tampering alarm indication circuitry and at least one electrical conductor located in the housing in operative association with the keypad, the at least one electrical conductor being coupled to the tampering alarm indication circuitry and being arranged such that extraction of at least one of the plurality of selectably depressible keys results in at least one break in the at least one electrical conductor, which causes the tampering alarm indication circuitry to provide a tampering alarm indication.

Preferably, the at least one electrical conductor is formed on a flexible circuit board substrate which is torn as the result of extraction of at least one of the plurality of selectably depressible keys. Additionally, the flexible circuit board substrate is a readily tearable flexible circuit board substrate.

In accordance with a preferred embodiment of the present invention each of the plurality of selectably depressible keys includes a key actuation protrusion and the flexible circuit board substrate is formed with an array of apertures for accommodating the key actuation protrusions. Additionally, the flexible circuit board substrate is formed with at least one pair of slits arranged adjacent at least one aperture of the array of apertures.

Preferably, the secure data entry device also includes at least one key engagement clip associated with at least one of the plurality of selectably depressible keys. Additionally, the at least one engagement clip includes a base portion, having relatively sharp side edges and an aperture for accommodating one of the key actuation protrusions and a pair of generally upstanding side portions, each of the upstanding side portions including a bent over top edge and a pair of bent over side edges. Preferably, each of the bent over side edges includes a serrated upper edge portion.

In accordance with a preferred embodiment of the present invention the key actuation protrusions are formed with transverse apertures formed therein. Additionally, the secure data entry device also includes at least one cutting element mounted in at least one of the transverse apertures and extending therethrough. Preferably, the flexible circuit board substrate includes a portion overlying the at least one cutting element.

Preferably, the secure data entry device also includes at least one locking washer lockingly engaging at least one of the key actuation protrusions.

In accordance with a preferred embodiment of the present invention the flexible circuit board substrate is adhered to a bottom surface of the keypad.

In accordance with a preferred embodiment of the present invention the secure data entry device also includes a support element and the flexible circuit board substrate is adhered to a surface of the support element. Additionally, the flexible circuit board substrate is also adhered to a bottom surface of the keypad.

BRIEF DESCRIPTION OF DRAWINGS

The present invention will be understood and appreciated more fully from the following detailed description, taken in conjunction with the drawings in which.

DETAILED DESCRIPTION OF PREFERRED EMBODIMENTS

Reference is now made to FIGS. 1A-1C and 2A, which illustrate a secure keypad device 100 constructed and operative in accordance with a preferred embodiment of the present invention.

As seen in FIGS. 1A-1C and 2A, the secure keypad device 100 includes a housing, preferably including a top housing element 102 and a bottom housing element 104. Top housing element 102 includes, on a top surface 106 thereof, a display window 108, through which a display (not shown) may be viewed, and an array 110 of key apertures 112.

A resilient key mat 116, preferably formed of a resilient plastic or rubber, defines a plurality of depressible keys 118, preferably integrally formed with the remainder of key mat 116, which partially extend through key apertures 112. Underlying each of keys 118 is a key actuation protrusion 120.

Underlying key mat 116 is a flexible, readily tearable anti-tampering grid 122, preferably formed of a multiplicity of interconnected anti-tampering electrical conductors 124 associated with a flexible substrate 126, such as a PSCR security label VP/N MSC252-009-01-A, including an adhesive layer, made by Apollo (Zhuhai) Electronics Co. LTD., Apollo Building, Lan Pu Industrial Area E, Jiu Zhou Road, Zhu Hai, P. R. C, with a thickness of 0.15 mm. It is appreciated that tearing of anti-tampering grid 122 invariably produces a break in one or more conductors 124. Anti-tampering grid 122 is preferably formed with an array of apertures 127 for accommodating key actuation protrusions 120. It is a particular feature of a preferred embodiment of the present invention that anti-tampering grid 122 also includes at least one pair, and preferably a plurality of pairs, of slits 128 arranged adjacent at least one aperture 127 and preferably a plurality of apertures 127.

Underlying anti-tampering grid 122, there is provided a light guide element 130 which includes an array 132 of apertures 134 which accommodate key actuation protrusions 120. It is a particular feature of a preferred embodiment of the present invention that light guide element 130 also includes at least one and preferably a plurality of recesses 136, which accommodate at least one and preferably a plurality of key engagement clips 140, associated with at least one key 118, and preferably a plurality of keys 118.

Figure 1A:
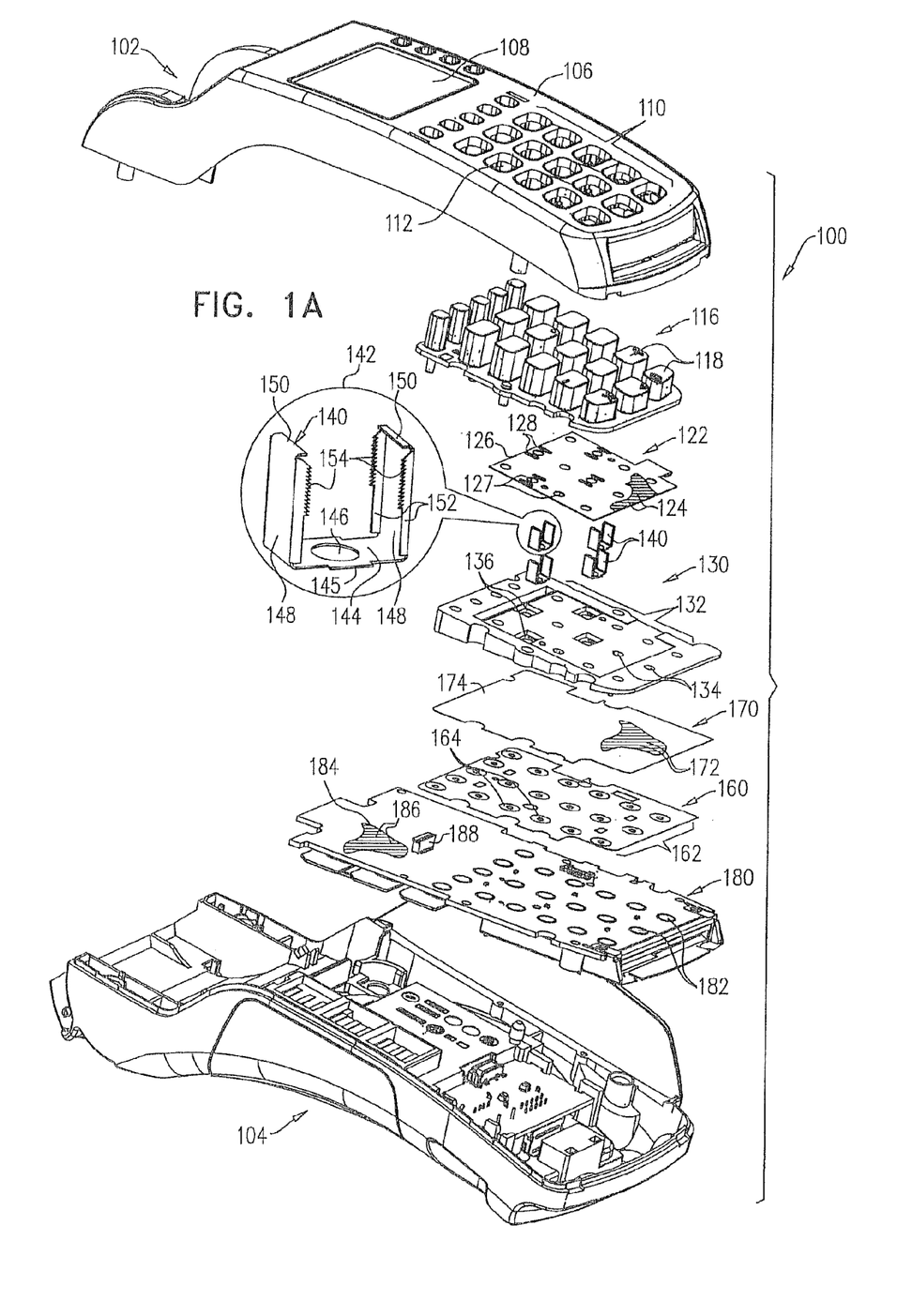
FIGS. 1A and 1B are simplified exploded view illustrations of a secure keypad device constructed and operative in accordance with a preferred embodiment of the present invention taken from opposite directions.

As seen clearly in enlargement 142 in FIG. 1A, each of key engagement clips 140 is preferably a bent metal element which preferably includes a base portion 144, having relatively sharp side edges 145 and an aperture 146 for accommodating key actuation protrusion 120, and a pair of generally upstanding side portions 148. Each of side portions 148 preferably includes a bent over top edge 150 and a pair of bent over side edges 152. Each of bent over side edges 152 preferably includes a serrated upper edge portion 154.

Figure 2A:
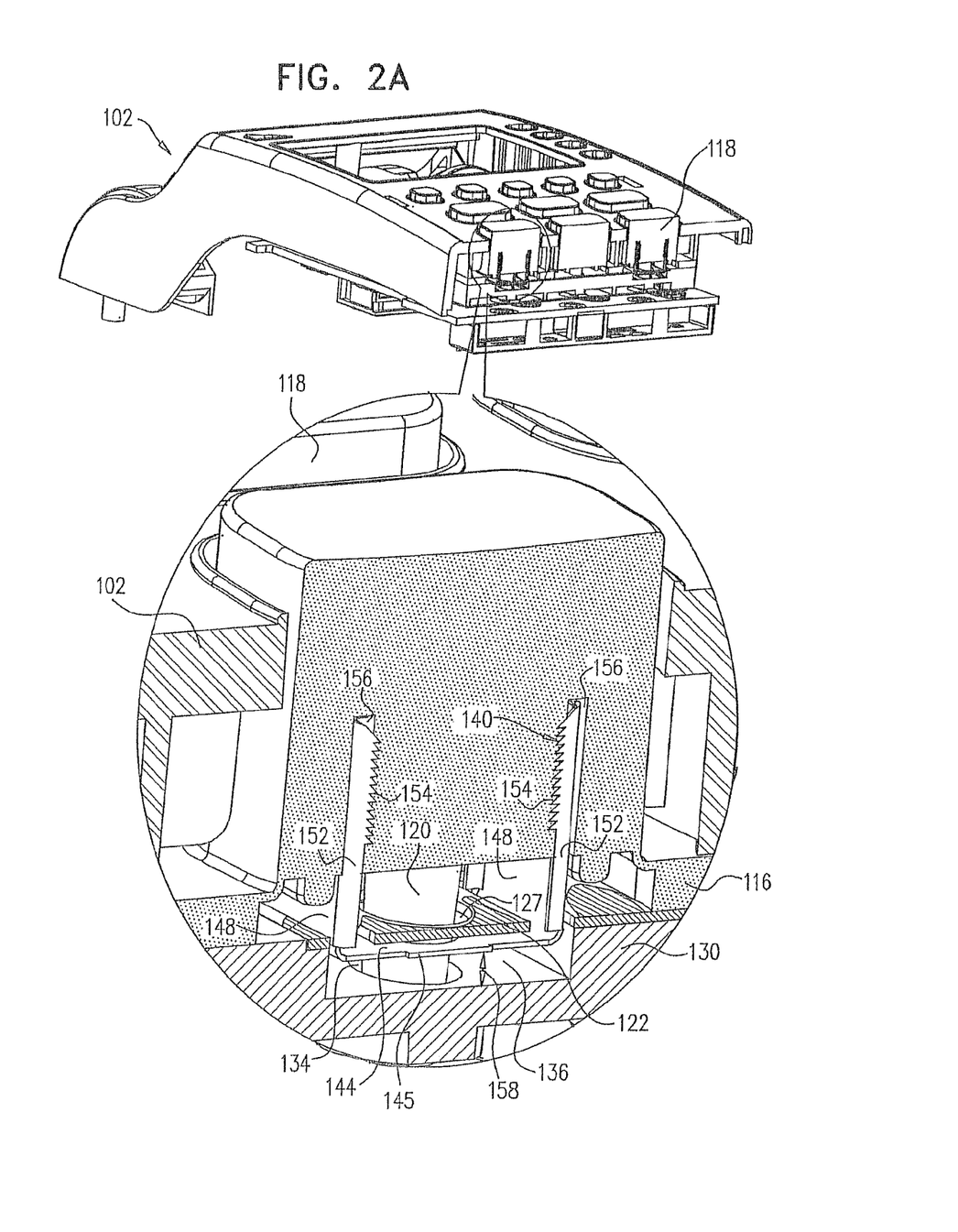
FIGS. 2A and 2B are simplified partially sectional, partially pictorial, illustrations of part of the secure keypad device of FIGS. 1A, 1B & 1C, prior to and following forced removal of a key during a tampering attempt, respectively, taken along lines II-II in FIG. 1C.

As shown with particularly in FIG. 2A, each key engagement clip 140 is arranged such that base portion 144 underlies anti-tampering grid 122 and side portions 148 extend through respective slits 128 in anti-tampering grid 122. Side portions 148 are embedded in corresponding preformed cuts 156 extending interiorly from the underside of each key 118 and are retained therein by engagement of serrated upper edge portions 154 with the interior of the key. Recesses 136 are seen to accommodate part of key engagement clips 140 which are depressed together with keys 118, along a travel distance 158.

Figure 1B:
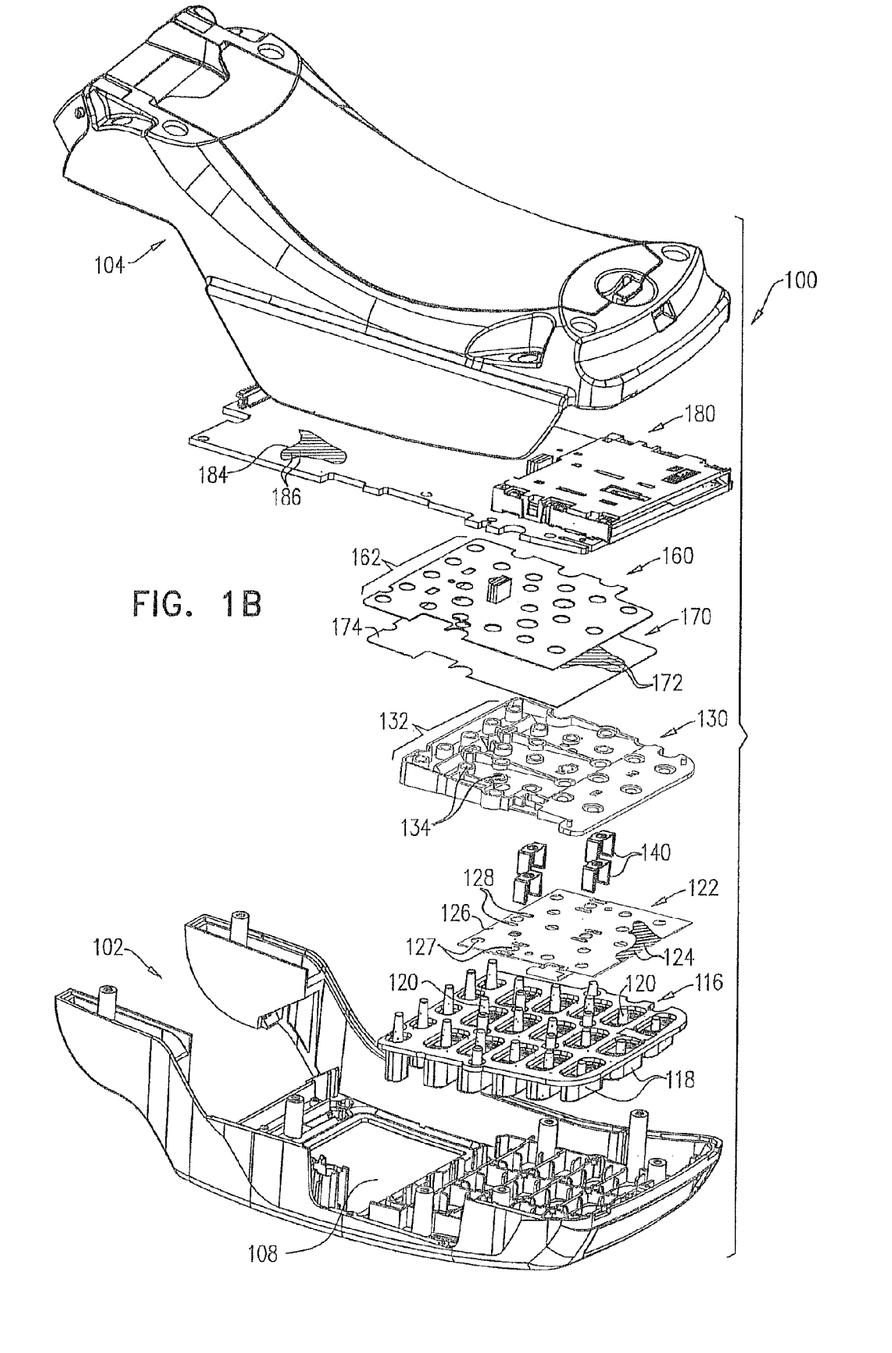
Figure 1C:
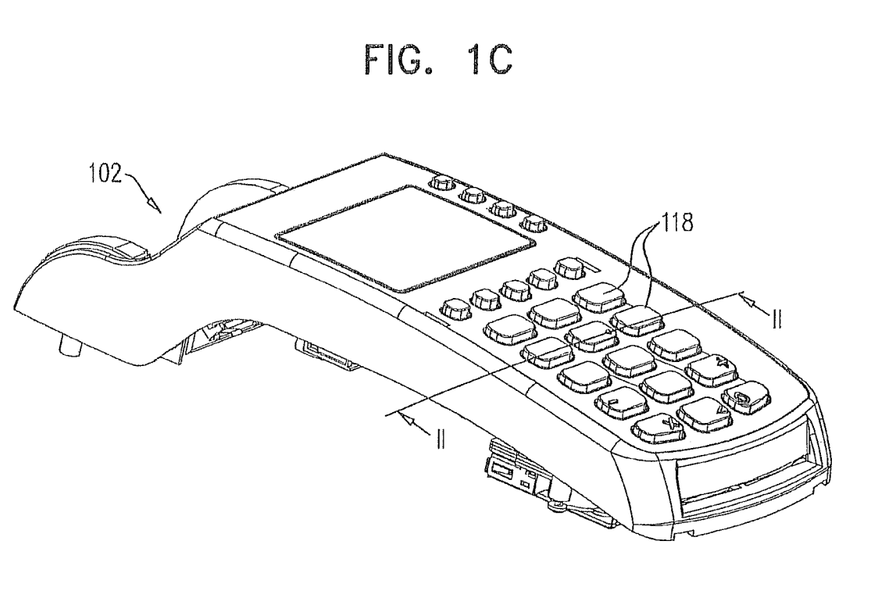
FIG. 1C is a simplified pictorial illustration of part of the secure keypad device of FIGS. 1A & 1B in an assembled state.

Underlying light guide element 130 and preferably adhered to an underside surface thereof is a key contact layer 160. Key contact layer 160 preferably includes an array 162 of raised resilient conductive domes 164, such as those commercially available from Snaptron, Inc. of Windsor, Colo., USA.

An anti-tampering grid 170, formed of a multiplicity of interconnected anti-tampering electrical conductors 172 associated with a flexible PCB substrate 174, is optionally provided between the light guide element 130 and the key contact layer 160.

Underlying key contact layer 160 is an electrical circuit board 180, which functions, inter alia, as a key contact pad board, defining a plurality of pairs of adjacent electrical contact pads 182, each pair underlying a corresponding dome 164, preferably made of carbon, metal or combination of carbon/metal. The arrangement of key contact pads 182 and of electrical circuit board 180 is such that depression of a key 118 by the finger of a user causes dome 164 to establish electrical contact with and between a corresponding pair of electrical contact pads 182 lying thereunder and in registration therewith. When key 118 is not depressed, no electrical contact exists between dome 164 and a pair of corresponding electrical contact pads 182 or between the adjacent pads of the pair.

Electrical circuit board 180 preferably includes an anti-tampering grid 184 formed of a multiplicity of interconnected anti-tampering electrical conductors 186. The anti-tampering grids 122, 170 and 184 are coupled to tampering alarm indication circuitry 188.

It is appreciated that in accordance with a preferred embodiment of the present invention, conductors 124 associated with anti-tampering grid 122 include at least one electrical conductor 124 located in the housing in operative association with the key mat 116, the at least one electrical conductor 124 being coupled to tampering alarm indication circuitry 188 and being arranged such that extraction of at least one of keys 118 results in at least one break in the at least one electrical conductor 124, which causes the tampering alarm indication circuitry 188 to provide a tampering alarm indication.

Figure 2B:
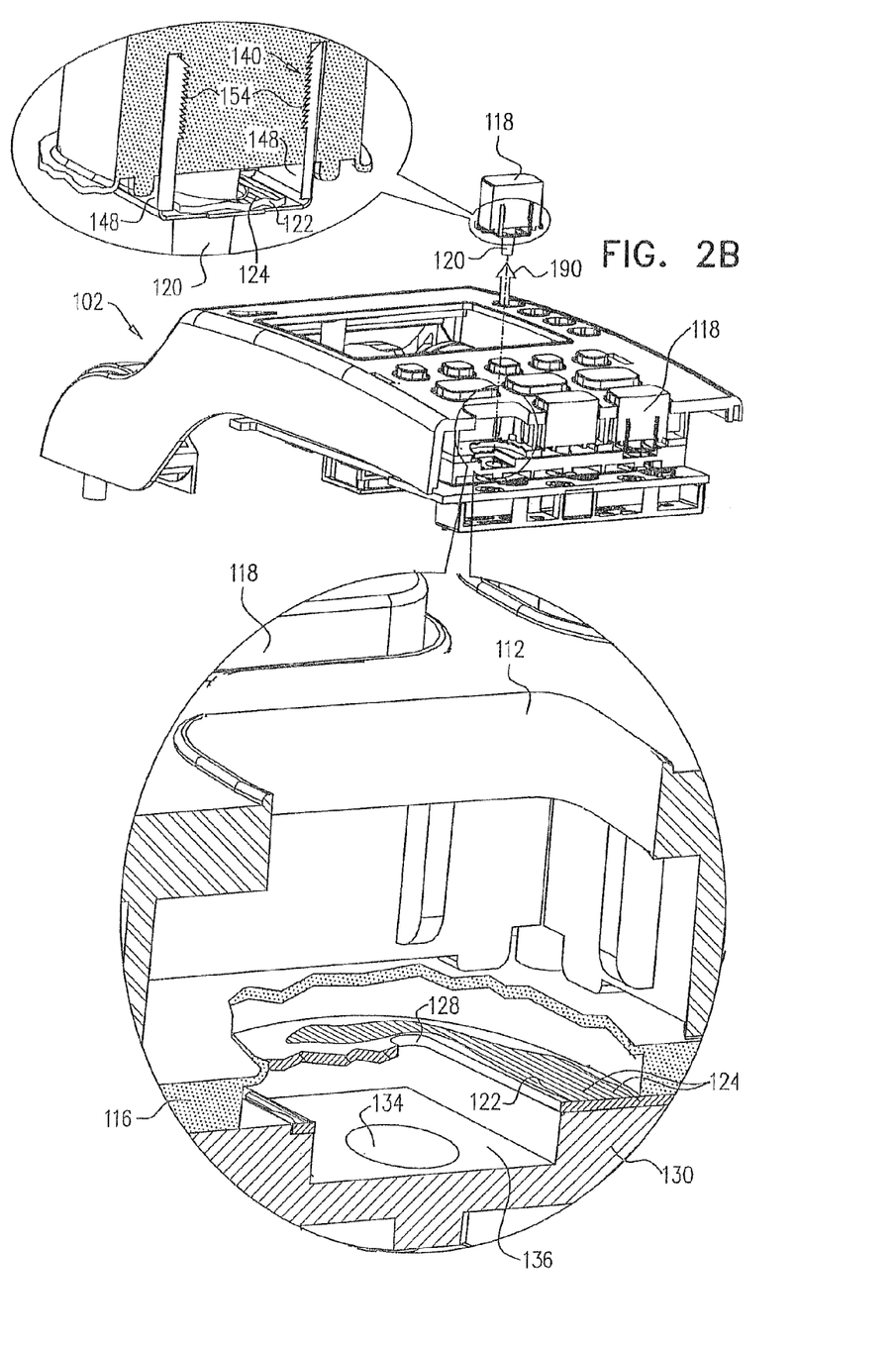

Referring now additionally to FIG. 2B, it is seen that it is a particular feature of the present invention that forced extraction of a key 118, as indicated by arrow 190, which is engaged by a key engagement clip 140 arranged such that base portion 144 underlies anti-tampering grid 122 and side portions 148 extend through respective slits 128 in anti-tampering grid 122, produces tearing of the anti-tampering grid 122 and consequent breaking of at least one conductor 124 which results in a tampering alarm indication.

Reference is now made to FIGS. 3A-3C and 4A, which illustrate a secure keypad device 300 constructed and operative in accordance with a preferred embodiment of the present invention.

As seen in FIGS. 3A-3C and 4A, the secure keypad device 300 includes a housing, preferably including a top housing element 302 and a bottom housing element 304. Top housing element 302 includes, on a top surface 306 thereof, a display window 308, through which a display (not shown) may be viewed, and an array 310 of key apertures 312.

A resilient key mat 316, preferably formed of a resilient plastic or rubber, defines a plurality of depressible keys 318, preferably integrally formed with the remainder of key mat 316, which partially extend through key apertures 312. Underlying each of keys 318 is a key actuation protrusion 320.

Underlying key mat 316 is a light guide element 322 which includes an array 324 of apertures 326 which accommodate key actuation protrusions 320. At least one slit 327 preferably connects multiple apertures 326 in light guide element 322.

Underlying and partially overlying light guide element 322 are respective overlying and underlying portions 328 and 329 of a flexible, readily tearable anti-tampering grid 330, preferably formed of a multiplicity of interconnected anti-tampering electrical conductors 332 associated with a flexible substrate 334 such as a security mesh film VFI P/N FCL268-001-01-A, made by Apollo (Zhuhai) Electronics Co. LTD., Apollo Building, Lanpu Industrial Area E, Jiu Zhou Road, Zhu Hai, P. R. C, with a thickness of 0.2 mm. It is appreciated that tearing of anti-tampering grid 330 invariably produces a break in one or more conductors 332. Anti-tampering grid 330 is preferably formed with an array of apertures 336 for accommodating key actuation protrusions 320.

Figure 4A:
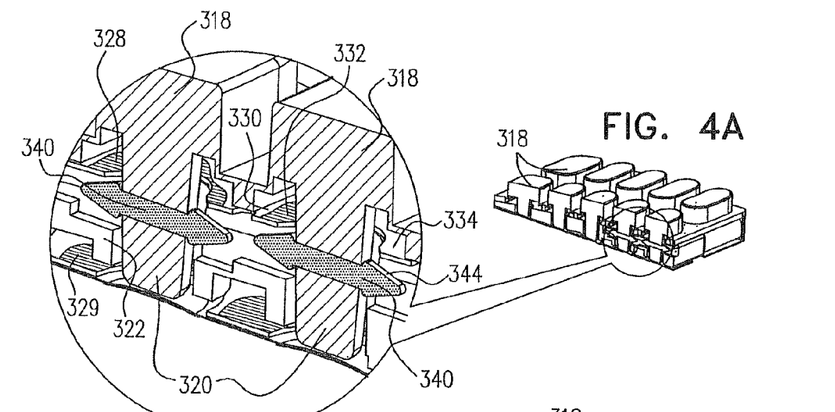
FIGS. 4A and 4B are simplified partially sectional, partially pictorial illustrations of part of the secure keypad device of FIGS. 3A, 3B & 3C, prior to and following forced removal of a key during a tampering attempt, respectively, FIG. 4A being taken along lines IVA-IVA in FIG. 3C.

Reference is now made particularly to FIG. 4A. As seen in FIG. 4A, it is a particular feature of the present invention that transversely protruding cutting elements 340 are mounted in transverse apertures 342 formed in key actuation protrusions 320. It is appreciated that cutting elements 340 are inserted in transverse apertures 342 when key actuation protrusions 320 extend through apertures 326 of light guide 322 to an extent that transverse apertures 342 of protrusions 320 lie below the overlying portion 328 of anti-tampering grid 330, such that cutting elements 340 normally lie below overlying portion 328 in one or more slit 327. As seen particularly in the enlargement of FIG. 4A, cutting edges 344 are formed on portions of cutting elements 340 extending beyond protrusions 320.

Figure 3A:
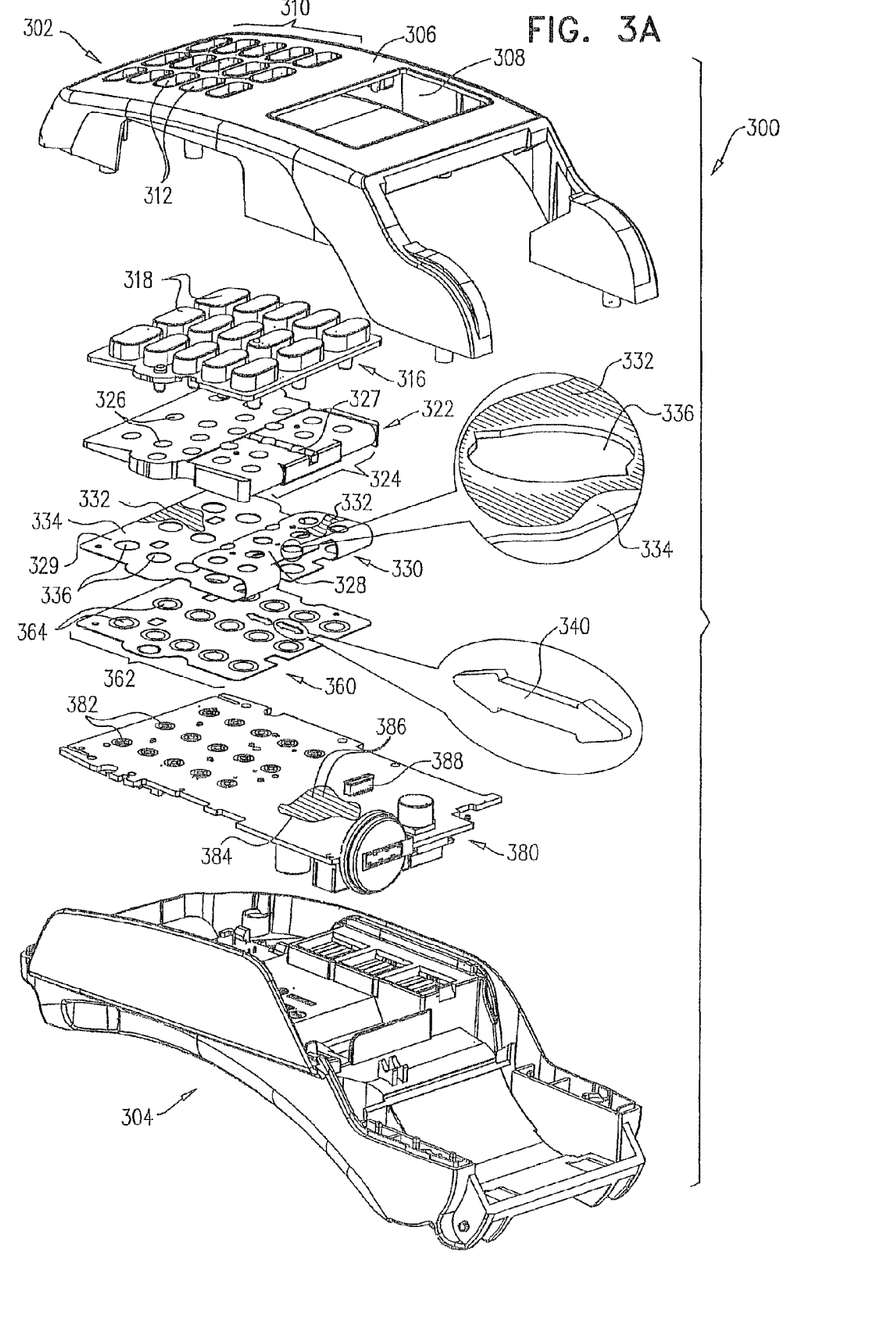
FIGS. 3A and 3B are simplified exploded view illustrations of a secure keypad device constructed and operative in accordance with another preferred embodiment of the present invention taken from opposite directions.
Figure 3B:
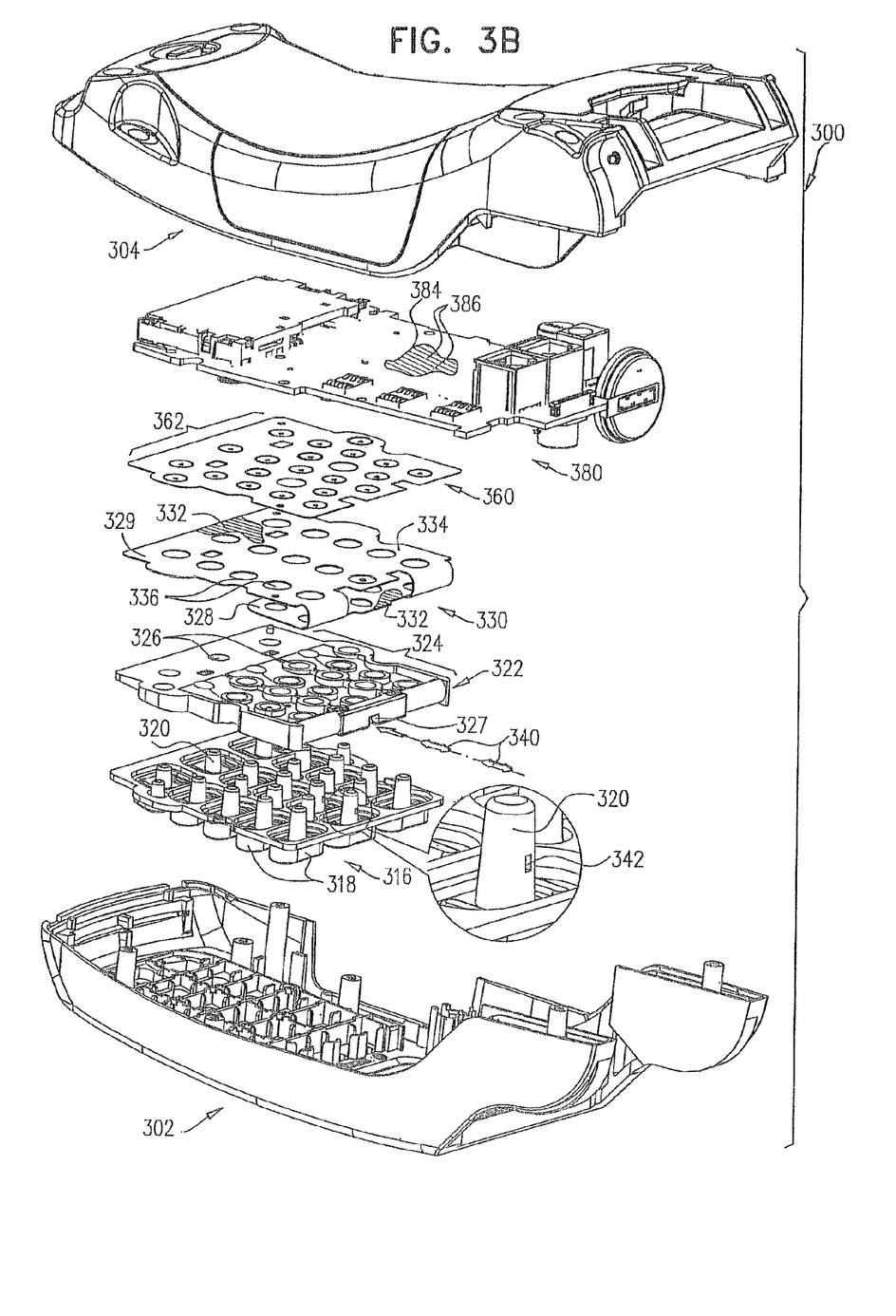
Figure 3C:
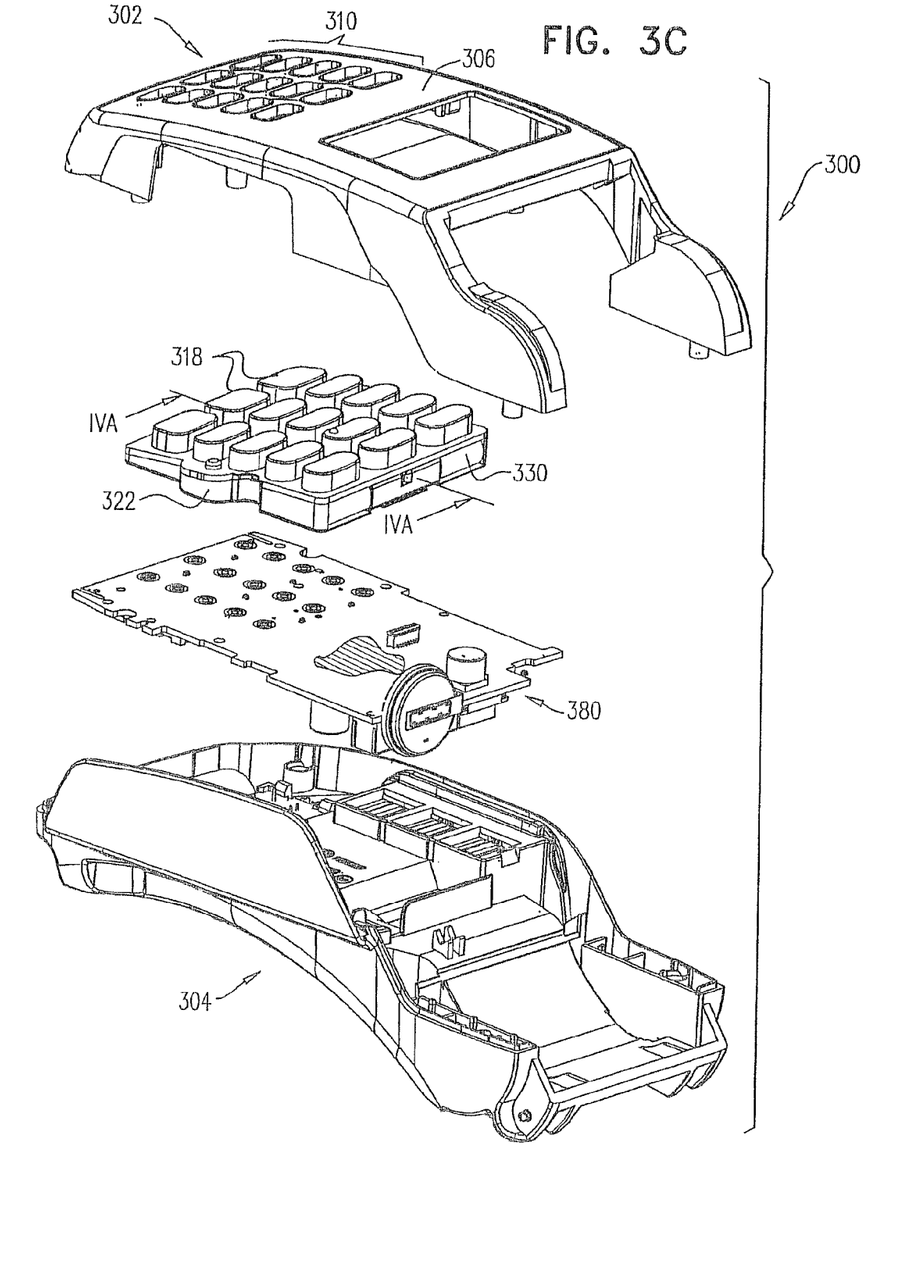
FIG. 3C is a simplified exploded view illustration of part of the secure keypad device of FIGS. 3A & 3B in a partially assembled state.

Underlying light guide element 322 and preferably adhered to an underside surface thereof is a key contact layer 360. Key contact layer 360 preferably includes an array 362 of raised resilient conductive domes 364, such as those commercially available from Snaptron, Inc. of Windsor, Colo., USA.

Underlying key contact layer 360 is an electrical circuit board 380, which functions, inter alia, as a key contact pad board, defining a plurality of pairs of adjacent electrical contact pads 382, each pair underlying a corresponding dome 364, preferably made of carbon, metal or combination of carbon/metal. The arrangement of key contact pads 382 and of electrical circuit board 380 is such that depression of a key 318 by the finger of a user causes dome 364 to establish electrical contact with and between a corresponding pair of electrical contact pads 382 lying thereunder and in registration therewith. When key 318 is not depressed, no electrical contact exists between dome 364 and a pair of corresponding electrical contact pads 382 or between the adjacent pads of the pair.

Electrical circuit board 380 preferably includes an anti-tampering grid 384 formed of a multiplicity of interconnected anti-tampering electrical conductors 386. The anti-tampering grids 330 and 384 are coupled to tampering alarm indication circuitry 388.

It is appreciated that in accordance with a preferred embodiment of the present invention, conductors 332 associated with anti-tampering grid 330 include at least one electrical conductor 332 located in the housing in operative association with the key mat 316, the at least one electrical conductor 332 being coupled to tampering alarm indication circuitry 388 and being arranged such that extraction of at least one of keys 318 results in at least one break in the at least one electrical conductor 332, which causes the tampering alarm indication circuitry 388 to provide a tampering alarm indication.

Figure 4B:
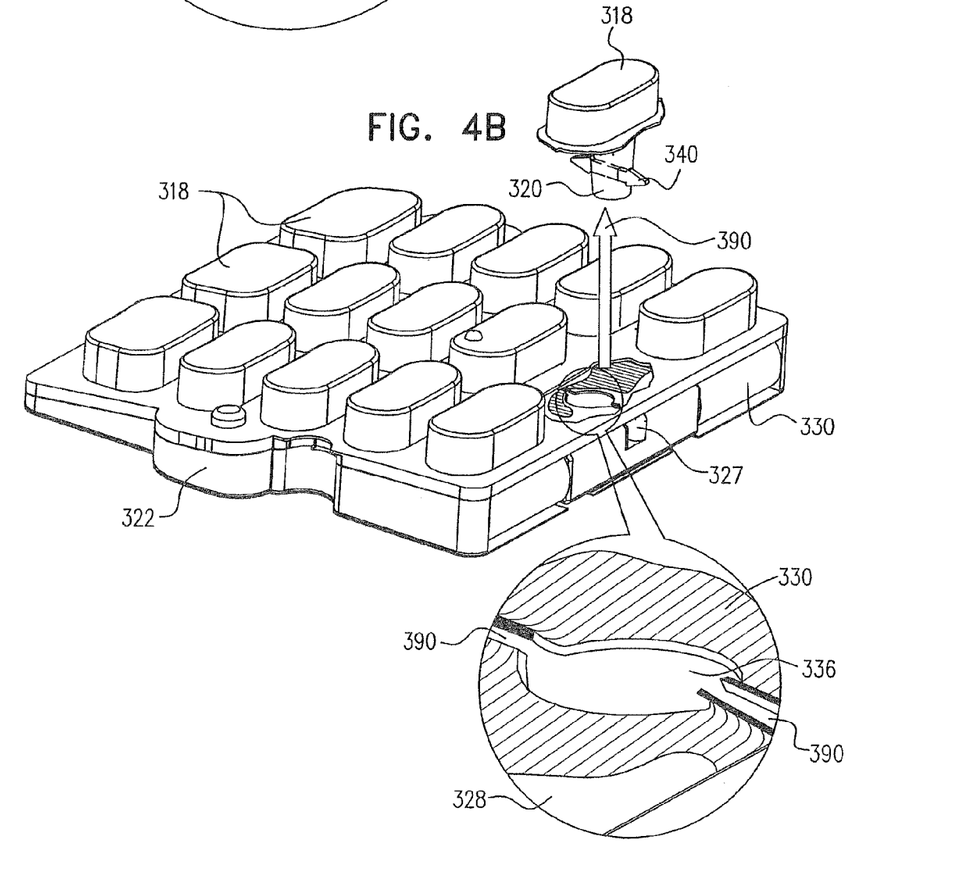

Referring now additionally to FIG. 4B, it is seen that it is a particular feature of the present invention that forced extraction of a key 318, as indicated by arrow 390, which is engaged by transversely protruding cutting element 340, underlying overlying portion 328 of anti-tampering grid 330, produces tearing of the anti-tampering grid 330 and consequent breaking of at least one conductor 332 which results in a tampering alarm indication, as seen particularly at reference numeral 390.

Reference is now made to FIGS. 5A-5C and 6A & 6B, which illustrate a secure keypad device 500 constructed and operative in accordance with a preferred embodiment of the present invention.

As seen in FIGS. 5A-6B, the secure keypad device 500 includes a housing, preferably including a top housing element 502 and a bottom housing element 504. Top housing element 502 includes, on a top surface 506 thereof, a display window 508, through which a display (not shown) may be viewed, and an array 510 of key apertures 512.

A resilient key mat 516, preferably formed of a resilient plastic or rubber, defines a plurality of depressible keys 518, preferably integrally formed with the remainder of key mat 516, which partially extend through key apertures 512. Underlying each of keys 518 is a key actuation protrusion 520.

Underlying key mat 516 is a support element, such as a light guide element 522, which includes an array 524 of apertures 526 which accommodate key actuation protrusions 520.

Overlying at least part of light guide element 522 is a flexible, readily tearable anti-tampering grid 530, preferably formed of a multiplicity of interconnected anti-tampering electrical conductors 532 associated with a flexible substrate 534 such as an FCL282-001-01-A, with a maximum thickness of 0.4 mm, made by GM Nameplate Asia PTE LTD., 53 Joo Koon Circle, Singapore, 629103, Singapore. It is appreciated that tearing of anti-tampering grid 530 invariably produces a break in one or more conductors 532. Anti-tampering grid 530 is preferably formed with an array 535 of apertures 536 for accommodating key actuation protrusions 520.

Figure 5A:
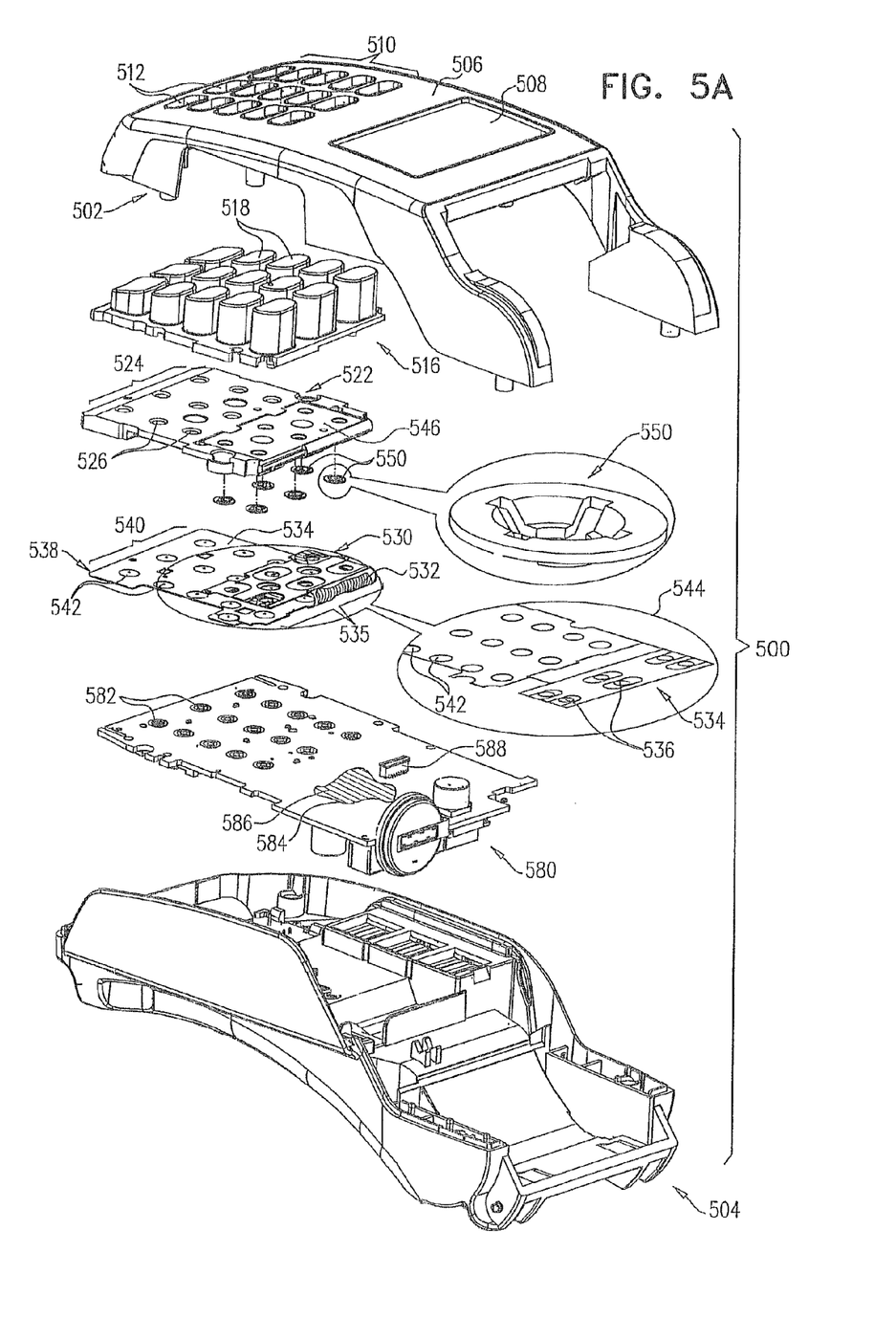
FIGS. 5A and 5B are simplified not-to-scale exploded view illustrations of a secure keypad device constructed and operative in accordance with yet another preferred embodiment of the present invention taken from opposite directions.
Figure 5B:
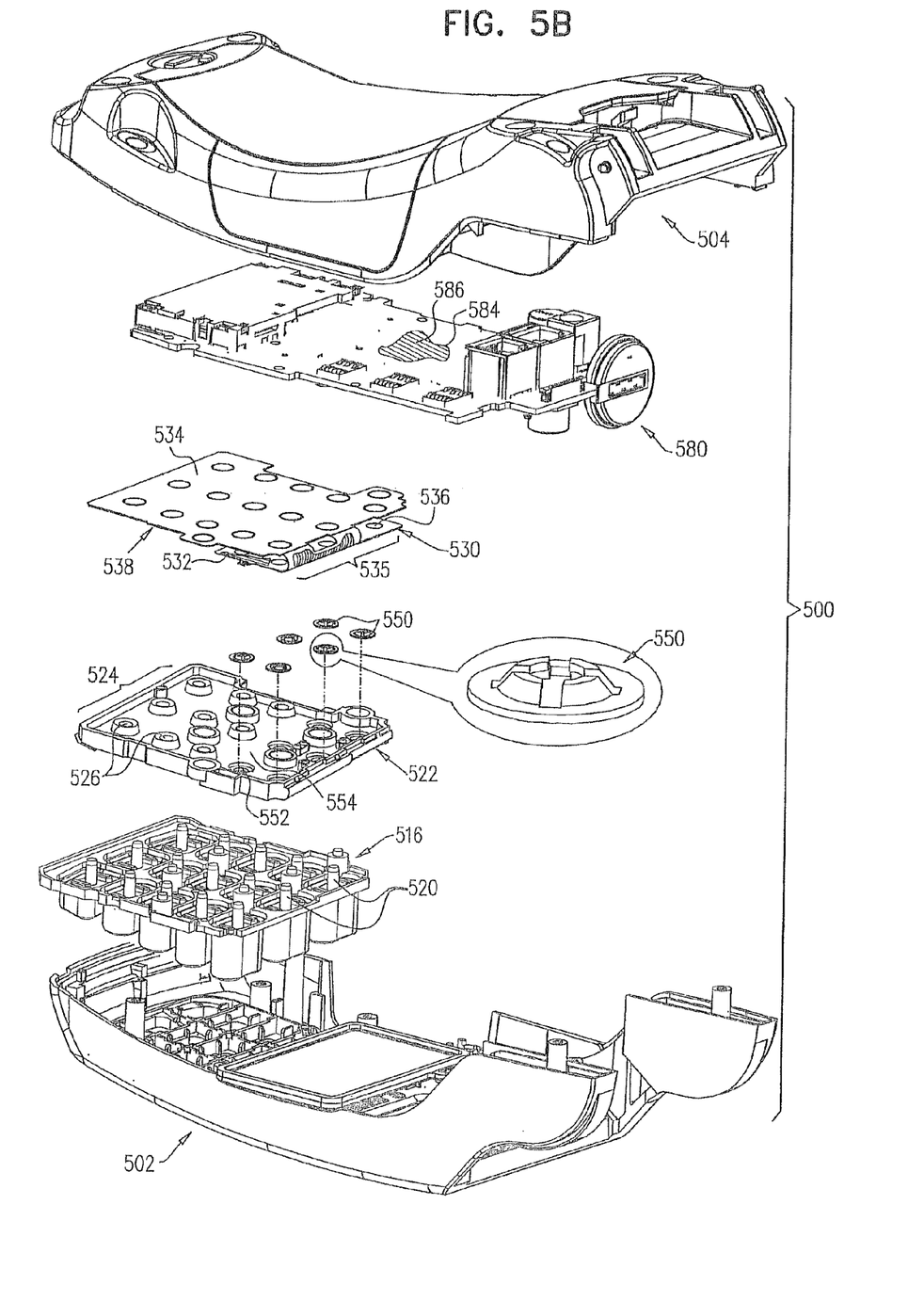
Figure 5C:
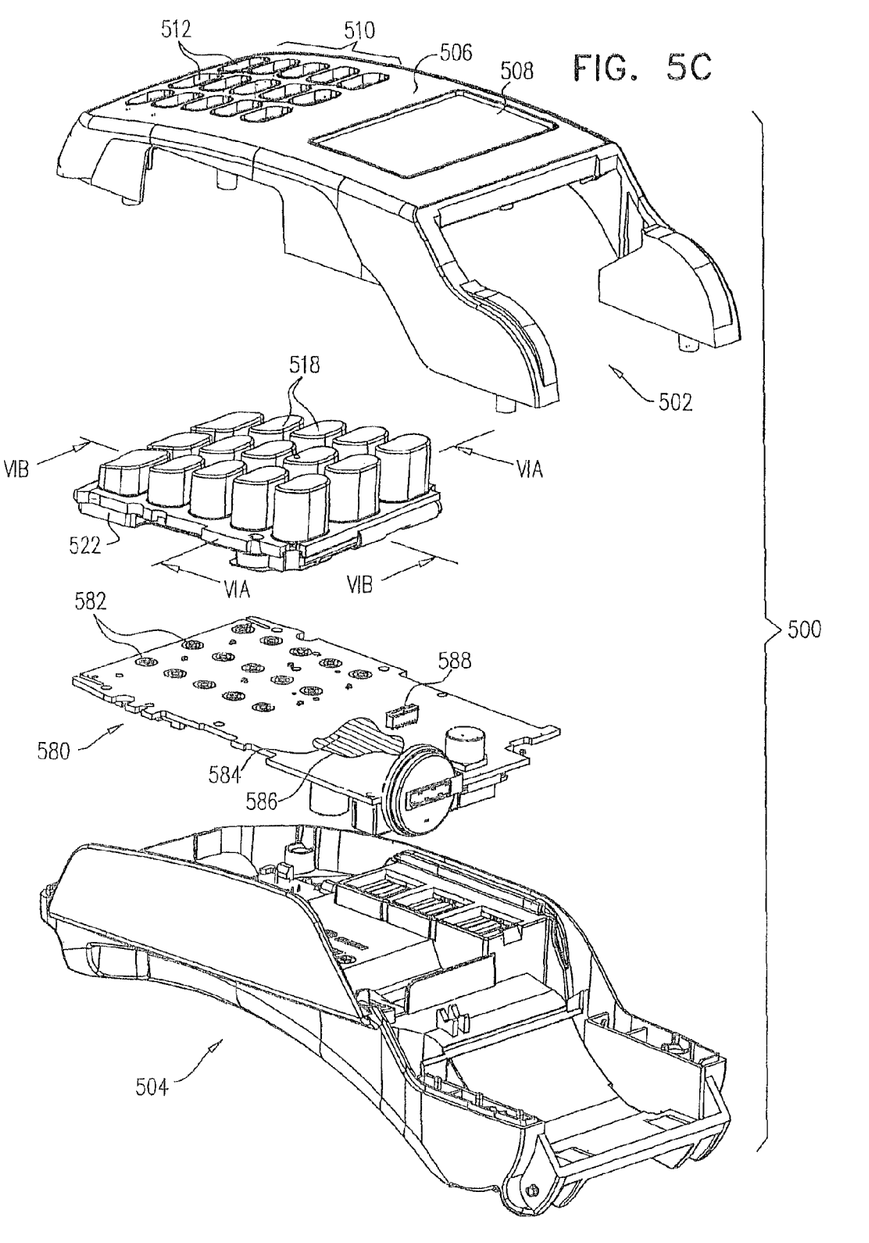
FIG. 5C is a simplified not-to-scale exploded view illustration of part of the secure keypad device of FIGS. 5A & 5B in a partially assembled state.

Also formed on flexible substrate 534 and underlying light guide element 522 and preferably adhered to an underside surface thereof is a key contact layer 538. Key contact layer 538 preferably includes an array 540 of raised resilient conductive domes 542, such as those commercially available from Snaptron, Inc. of Windsor, Colo., USA. As seen in FIGS. 5A and 5B, flexible substrate 534 is folded over light guide element 522, such that anti-tampering grid 530 lies over the light guide element 522 and key contact layer 538 lies thereunder. The flexible substrate 534 in an unfolded orientation is shown in enlargement 544 in FIG. 5A.

It is a particular feature of the illustrated embodiment of the invention shown in FIGS. 5A-6B that anti-tampering grid 530 is fixedly adhered to both the underside of key mat 516 and preferably also to a top surface 546 of light guide element 522, as by adhesive.

Figures 6A, 6B:
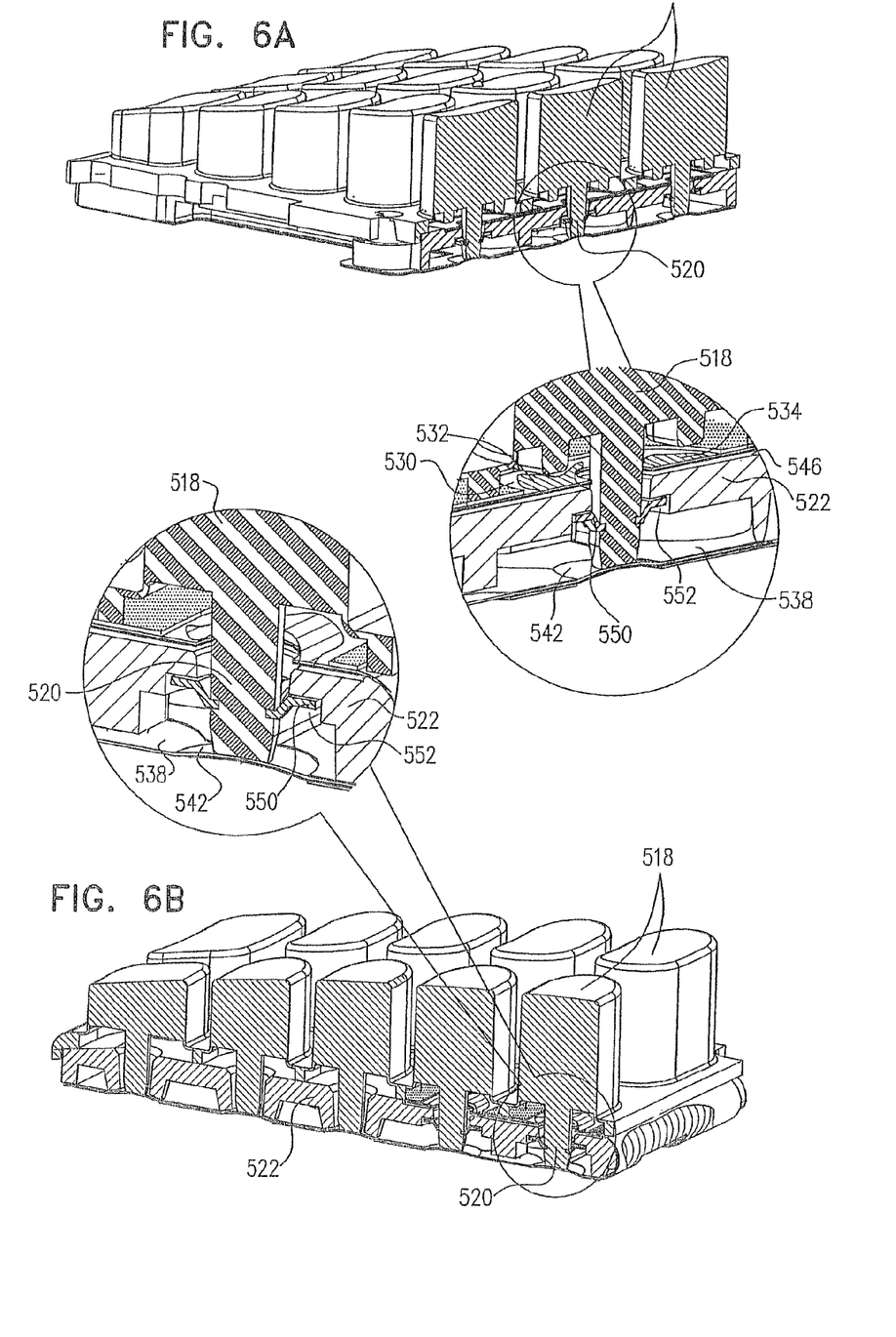
FIGS. 6A and 6B are simplified partially section, partially pictorial illustrations of part of the secure keypad device of FIGS. 5A, 5B & 5C, prior to forced removal of a key during a tampering attempt, taken along lines VIA-VIA and lines VIB-VIB in FIG. 5C, respectively.

Reference is now made particularly to FIGS. 6A and 6B. As seen particularly in FIGS. 6A and 6B, it is another particular feature of the present invention that a locking washer 550 lockingly engages at least one and preferably a plurality of key actuation protrusions 520 at a location thereon below light guide element 522. Preferably, locking washer 550 is seated in a recess 552 formed in an underside surface 554 of light guide element 522.

Underlying key contact layer 538 is an electrical circuit board 580, which functions, inter alia, as a key contact pad board, defining a plurality of pairs of adjacent electrical contact pads 582, each pair underlying a corresponding dome 542, preferably made of carbon, metal or combination of carbon/metal. The arrangement of key contact pads 582 and of electrical circuit board 580 is such that depression of a key 518 by the finger of a user causes dome 542 to establish electrical contact with and between a corresponding pair of electrical contact pads 582 lying thereunder and in registration therewith. When key 518 is not depressed, no electrical contact exists between dome 542 and a pair of corresponding electrical contact pads 582 or between the adjacent pads of the pair.

Electrical circuit board 580 preferably includes an anti-tampering grid 584 formed of a multiplicity of interconnected anti-tampering electrical conductors 586. The anti-tampering grids 530 and 584 are coupled to tampering alarm indication circuitry 588.

It is appreciated that in accordance with a preferred embodiment of the present invention, conductors 532 associated with anti-tampering grid 530 include at least one electrical conductor 532 located in the housing in operative association with the key mat 516, the at least one electrical conductor 532 being coupled to tampering alarm indication circuitry 588 and being arranged such that extraction of at least one of keys 518 results in at least one break in the at least one electrical conductor 532, which causes the tampering alarm indication circuitry 588 to provide a tampering alarm indication.

Figure 7A:
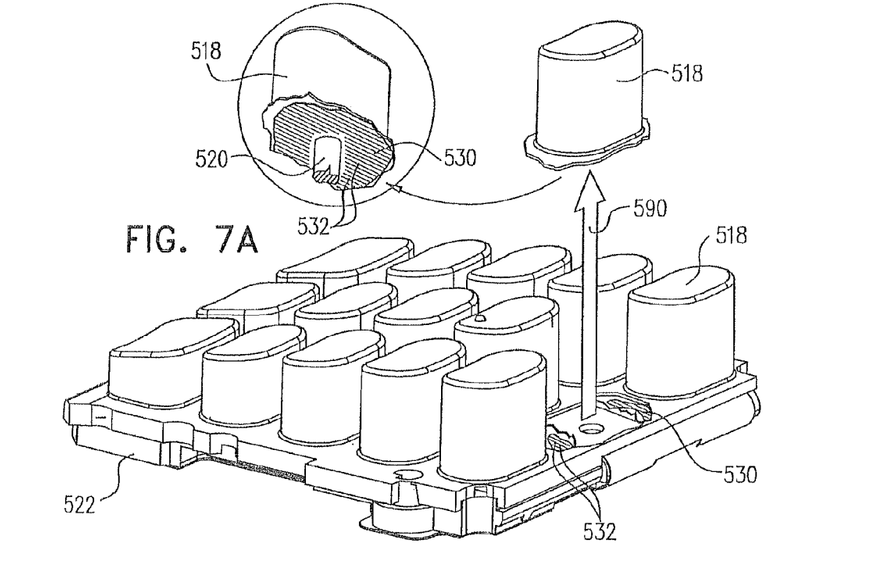
FIGS. 7A and 7B are simplified partially section, partially pictorial illustrations of part of the secure keypad device of FIGS. 5A, 5B & 5C following forced removal of a key during a tampering attempt, FIG. 7B being taken along lines VIA-VIA in FIG. 5C.
Figure 7B:
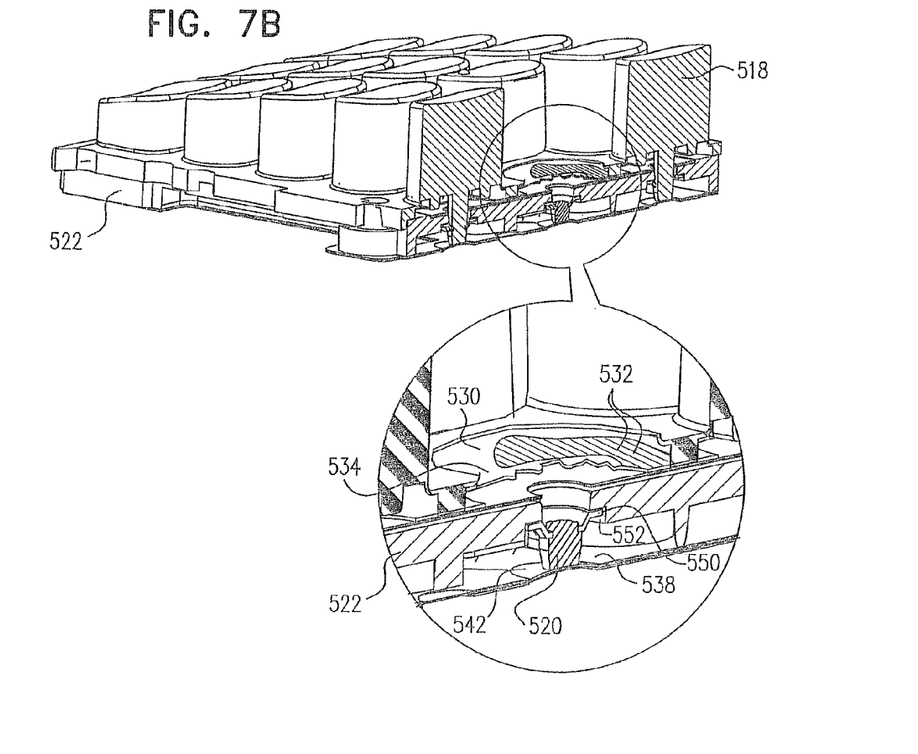

Referring now additionally to FIGS. 7A and 7B, it is seen that it is a particular feature of the present invention that forced extraction of a key 518, as indicated by arrow 590, the underside of which is fixedly adhered to a portion of anti-tampering grid 530, produces tearing of the anti-tampering grid 530 and consequent breaking of at least one conductor 532 which results in a tampering alarm indication.

It is further seen that forced extraction of a key 518, as indicated by arrow 590, causes breakage of key actuation protrusion 520, since the bottom portion thereof is retained below the light guide element 522 by locking washer 550.

It is particularly noted that either of the features described hereinabove with reference to FIGS. 5A-7B, namely, adherence of the anti-tampering grid 530 to one or more keys 518 and retention of the bottom part of the key actuation protrusion, may be incorporated in either of the embodiments described above with reference to FIGS. 1A-2B and 3A-4B respectively.

It is also particularly noted that any suitable combination of the security features relating to forced extraction of keys may be employed in accordance with a preferred embodiment of the present invention.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

The invention claimed is:

1. A secure data entry device comprising:
    a housing;
    a keypad mounted in said housing and including a plurality of protruding selectably depressible keys;
    anti-tampering grid tearing elements associated with said keys and operative to tear a flexible, tearable anti-tampering grid upon extraction of a key from said keypad;
    tampering alarm indication circuitry; and
    at least one electrical conductor located in said housing in operative association with said keypad,
    said at least one electrical conductor being formed on said flexible, tearable, anti-tampering grid,
    said flexible, tearable anti-tampering grid being formed of a multiplicity of interconnected anti-tampering electrical conductors associated with a flexible substrate which is torn as the result of extraction of at least one of said plurality of protruding selectably depressible keys,
    said at least one electrical conductor being coupled to said tampering alarm indication circuitry and being arranged such that extraction of at least one of said plurality of protruding selectably depressible keys from said keypad results in at least one break in said at least one electrical conductor, which causes said tampering alarm indication circuitry to provide a tampering alarm indication.

2. A secure data entry device according to claim 1 and wherein:
    each of said plurality of protruding selectably depressible keys includes a key actuation protrusion; and
    said flexible circuit board substrate is formed with an array of apertures for accommodating said key actuation protrusions.

3. A secure data entry device according to claim 2 and wherein:
    said flexible circuit board substrate is formed with at least one pair of slits arranged adjacent at least one aperture of said array of apertures.

4. A secure data entry device according to claim 3 and also comprising at least one key engagement clip associated with at least one of said plurality of protruding selectably depressible keys.

5. A secure data entry device according to claim 4 and wherein said at least one engagement clip includes:
    a base portion, having relatively sharp side edges and an aperture for accommodating one of said key actuation protrusions; and
    a pair of generally upstanding side portions, each of said upstanding side portions comprising:
    a bent over top edge; and
    a pair of bent over side edges.

6. A secure data entry device according to claim 5 and wherein each of said bent over side edges includes a serrated upper edge portion.

7. A secure data entry device according to claim 2 and wherein said key actuation protrusions are formed with transverse apertures formed therein.

8. A secure data entry device according to claim 7 and also comprising at least one cutting element mounted in at least one of said transverse apertures and extending therethrough.

9. A secure data entry device according to claim 8 and wherein said flexible circuit board substrate comprises a portion overlying said at least one cutting element.

10. A secure data entry device according to claim 2 and also comprising at least one locking washer lockingly engaging at least one of said key actuation protrusions.

11. A secure data entry device according to claim 1 and wherein said flexible circuit board substrate is adhered to a bottom surface of said keypad.

12. A secure data entry device according to claim 1 and also comprising a support element and wherein said flexible circuit board substrate is adhered to a surface of said support element.

13. A secure data entry device according to claim 12 and wherein said flexible circuit board substrate is also adhered to a bottom surface of said keypad.

* * * * *